United States Patent
Zeng et al.

(10) Patent No.: US 7,939,939 B1
(45) Date of Patent: May 10, 2011

(54) STABLE GOLD BUMP SOLDER CONNECTIONS

(75) Inventors: Kejun Zeng, Coppell, TX (US); Wei Qun Peng, Coppell, TX (US); Rebecca L. Holford, Garland, TX (US); Robert John Furtaw, Dallas, TX (US); Bernardo Gallegos, The Colony, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/867,051

(22) Filed: Oct. 4, 2007

Related U.S. Application Data

(60) Provisional application No. 60/943,194, filed on Jun. 11, 2007.

(51) Int. Cl.
*H01L 23/52* (2006.01)
(52) U.S. Cl. ............... 257/737; 257/738; 257/E21.058; 257/E23.021; 228/180.22
(58) Field of Classification Search ............ 228/180.22; 257/200, 738, 772, 778, E23.021, E21.058, 257/737, E23.069
See application file for complete search history.

(56) References Cited

U.S. PATENT DOCUMENTS

| | | | | |
|---|---|---|---|---|
| 6,798,072 B2 * | 9/2004 | Kajiwara et al. | ............... | 257/778 |
| 2003/0172587 A1 * | 9/2003 | Weder | ............ | 47/41.01 |
| 2003/0222352 A1 * | 12/2003 | Kung et al. | ............ | 257/772 |
| 2004/0251546 A1 * | 12/2004 | Lee et al. | ............ | 257/738 |
| 2005/0072835 A1 * | 4/2005 | Choi et al. | ............... | 228/180.22 |
| 2007/0152331 A1 | 7/2007 | Kang et al. | | |

* cited by examiner

*Primary Examiner* — Matthew E Warren
*Assistant Examiner* — Fang-Xing Jiang
(74) *Attorney, Agent, or Firm* — Yingsheng Tung; Wade J. Brady, III; Frederick J. Telecky, Jr.

(57) ABSTRACT

A metallic interconnect structure (200) for connecting a gold bump (205) and a copper pad (212), as used for example in semiconductor flip-chip assembly. A first region (207) of binary $AuSn_2$ intermetallic is adjacent to the gold bump. A region (208) of binary $AuSn_4$ intermetallic is adjacent to the first $AuSn_2$ region. Then, a region (209) of binary gold-tin solid solution is adjacent to the $AuSn_4$ region, and a second region (210) of binary $AuSn_2$ intermetallic is adjacent to the solid solution region. The second $AuSn_2$ region is adjacent to a nickel layer (213) (preferred thickness about 0.08 μm), which covers the copper pad. The nickel layer insures that the gold/tin intermetallics and solutions remain substantially free of copper and thus avoid ternary compounds, providing stabilized gold bump/solder connections.

4 Claims, 4 Drawing Sheets

STABLE GOLD BUMP SOLDER CONNECTIONS

FIELD OF THE INVENTION

The present invention is related in general to the field of metallurgical systems with application to electronic systems and semiconductor devices, and more specifically to stable gold bump solder connections.

DESCRIPTION OF THE RELATED ART

The growing popularity of flip-chip assembly in the fabrication process flow of silicon integrated circuit (IC) devices is driven by several facts. First, the electrical performance of the semiconductor devices can be improved when the parasitic inductances correlated with conventional wire bonding interconnection techniques are reduced. Second, flip-chip assembly provides higher interconnection densities between chip and package than wire bonding. Third, flip-chip assembly consumes less silicon "real estate" than wire bonding, and thus helps to conserve silicon area and reduce device cost. And fourth, the fabrication cost can be reduced, when concurrent gang-bonding techniques are employed rather than consecutive individual bonding steps.

In order to reduce bump size and bump pitch, efforts were undertaken to replace the earlier solder-based interconnecting balls with gold bumps, especially by an effort to create gold bumps by a modified wire ball technique. Typically, the gold bumps are created on an aluminum layer of the contact pads of semiconductor chips. Subsequently, the chips are attached to substrates using solder.

While conventional solders of lead/tin alloys have been used in electronic device fabrication for many years, environmental concerns have recently promoted an effort to eliminate the lead from the solder alloys and use pure tin, a tin alloy, or another solder without lead. Typically the tin-based alloy is deposited on the substrate contact pads.

When the gold bumps are joined to the substrate pads by reflowing the solder that has been deposited on the pads, a number of gold/tin intermetallics are formed. Because of the high dissolution rate of gold in the molten solders, the solder joints with gold bumps have, after one reflow, a large volume fraction of intermetallic compounds, with $AuSn_4$ the major phase that greatly embrittle the joints. After two or more reflows, which are typically needed for assembling package-on-package products, the gold bumps may be completely consumed and converted into gold/tin intermetallic compounds. Because of the brittleness of these compounds and the direct contact of the intermetallics with the aluminum pad on the chip side, the joints frequently fail reliability tests such as the mechanical drop test by cracking at the bump/chip interface.

For chips which have the gold bumps positioned on an aluminum layer, an additional problem appears after the consumption of the gold bump: In consecutive reflow operations (for many devices, three more reflows are needed), the aluminum/gold intermetallics may also be lost so that the aluminum pad loses its solderablity altogether. Experience has shown that these phenomena are strongly aggravated by the copper pads customarily used as contacts of the substrates.

SUMMARY OF THE INVENTION

Applicants conducted a metallurgical and statistical investigation of the contact structures, coupled with binary and ternary phase diagrams. The investigation of the contacts discovered that copper, which diffuses into the solder, replaces some gold in binary gold/tin intermetallics to form ternary compounds, thus lowering the melting temperature, gradually dissolving the binary gold/tin intermetallics, and dissolving more gold from the bump.

In the analysis of the solder contacts, applicants further discovered that, after implementing a nickel layer to cover the copper contact and to practically eliminate the copper diffusion into the solder, the gold/tin intermetallics can be stabilized as distinct regions. They form "coating" layers around the gold bump, reducing additional gold dissolution during subsequent reflow processes. They thus preserve the remaining gold bump as soft, stress-mitigating material to pass mechanical tests. In addition, the gold preserved after the assembly processes will be large enough to withstand gold solid-state dissolution into solder during prolonged high temperature storage or field application. With less gold dissolved into the solder, the volume fraction of gold/tin intermetallics in solder is smaller and thus the joint less brittle.

One embodiment of the invention is a metallic interconnect structure for connecting a gold bump and a copper pad. A first region of binary $AuSn_2$ intermetallic is in contact with the gold bump. A region of binary $AuSn_4$ intermetallic is in contact with the first $AuSn_2$ region. Then, a region of binary gold-tin solid solution is in contact with the $AuSn_4$ region, and a second region of binary $AuSn_2$ intermetallic is in contact with the solid solution region. The second $AuSn_2$ region is in contact with a nickel layer (preferred thickness about 0.08 μm), which covers the copper pad. The nickel layer insures that the gold/tin intermetallics and solutions are substantially free of copper and thus remain binary. In certain embodiments, there is a region of binary AuSn between the gold bump and the first $AuSn_2$ region.

Another embodiment of the invention is a device including a semiconductor chip with contact pads having a gold bump, and a dielectric substrate, on which the chip is assembled. The substrate has contacts for external connections, which include a copper contact area and a nickel layer (between about 0.04 and 2.0 μm thick) covering the contact area. Interconnecting the gold bumps and the nickel layer are metallic structures, which include a first region of binary $AuSn_2$ intermetallic in contact with the gold bump; a region of binary $AuSn_4$ intermetallic in contact with the first $AuSn_2$ region; a region of binary gold-tin solid solution in contact with the $AuSn_4$ region; and a second region of binary $AuSn_2$ intermetallic in contact with the solid solution region and with the nickel layer.

Another embodiment of the invention is a method for fabricating a device, which has a semiconductor chip with contact pads of gold bumps, and a dielectric substrate with copper contact areas for external connections. A nickel layer is deposited over the copper contact area; the layer thickness of preferably 0.08 μm suppresses any copper diffusion. While the nickel surface is still wet, a body of tin-based solder is deposited on the nickel layer. The preferred deposition method is either electrolytic plating or electroless plating. The preferred solder reflow temperature is between 217 and 280° C.

Next, the chip is flipped towards the substrate so that the gold bumps face the solder bodies and the respective gold bumps can be aligned with the solder bodies. The aligned gold bumps are brought into contact with the respective solder bodies, the temperature is raised to slightly above the reflow temperature and kept at the peak temperature constant for a length of time (preferably less than 10 s). The solder bodies are reflowed and gold/tin intermetallics and solutions are formed. Finally, the temperature is lowered again to ambient temperature, solidifying the intermetallics and solutions into regions.

These regions and their sequential structure remain intact even when the solder reflow cycle is repeated several more times (for example five times or more). Since substantially no copper can diffuse through the nickel layer to convert the binary character of the regions into lower-melting ternaries, the regions act as barriers against further dissolution of the gold bump and thus stabilize the remaining gold bump.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1A:
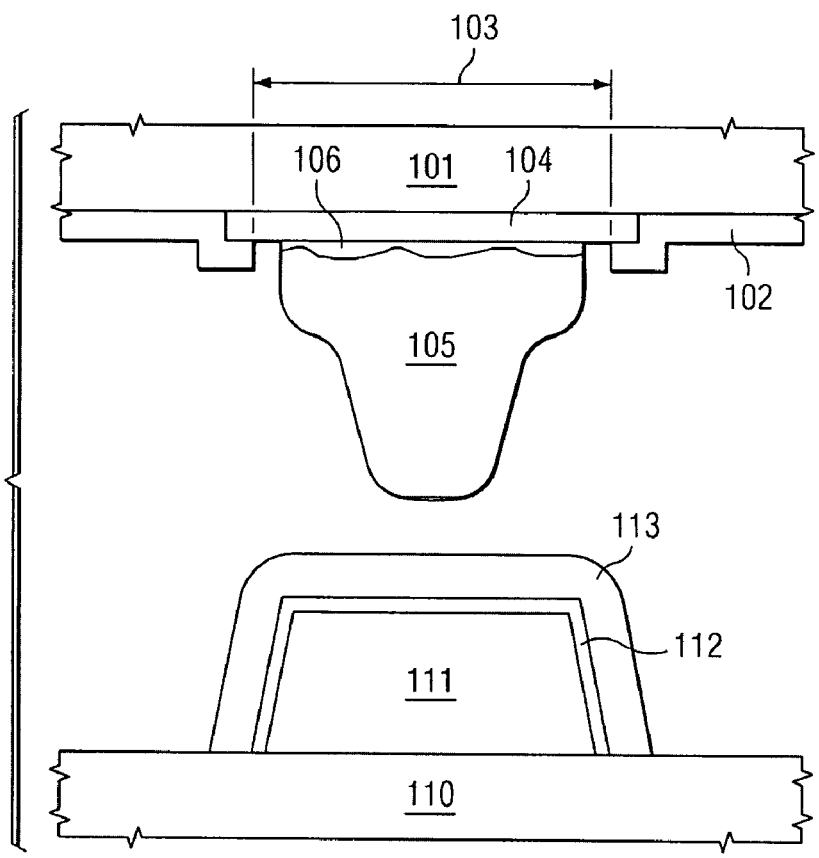
FIG. 1A shows a schematic cross section of a semiconductor chip contact pad with gold bump and a substrate copper contact pad covered with a nickel layer according to an embodiment of the invention.
Figure 1B:
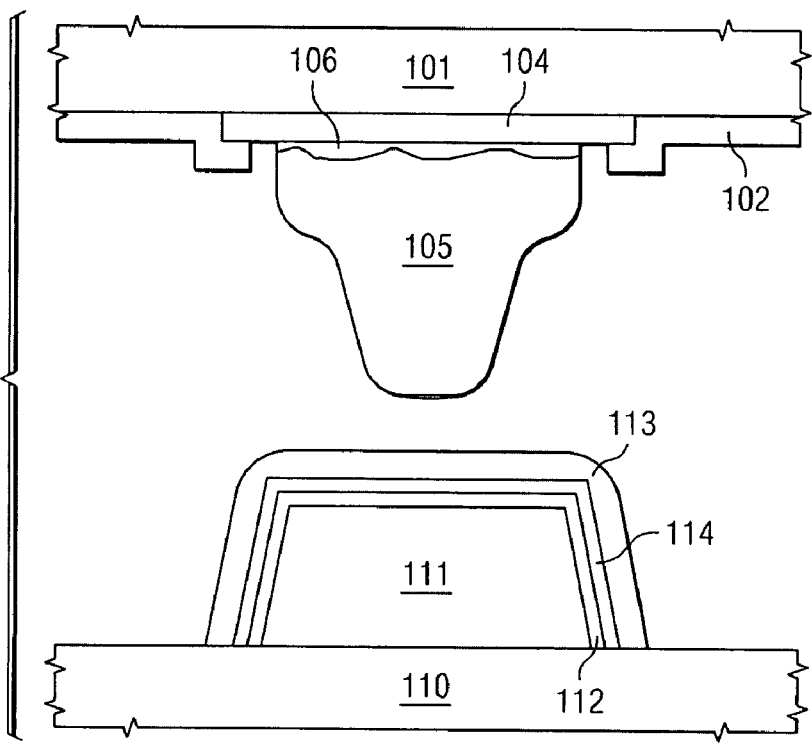
FIG. 1B shows a schematic cross section of a semiconductor chip contact pad with gold bump and a substrate copper contact pad covered with a nickel layer and a gold layer according to an embodiment of the invention.

An embodiment of the invention is a metallic interconnect structure for connecting a gold bump and a copper pad. FIGS. 1A and 1B show the gold bump and the copper pad before forming the interconnect structure. In FIG. 1A, a portion of a semiconductor chip 101 has an insulating overcoat 102 (for example, silicon nitride or oxynitride) with a window 103 in the overcoat. The window exposes a portion of chip metallization 104, which is preferably aluminum or aluminum alloy with a surface bondable to gold. Alternatively, metallization 104 may be made of copper; again, the surface of pad 104 needs to be bondable to gold. For example, the surface of pad 104 may have a thin layer of gold or palladium. The exposed metal in window 103 serves as a pad for electrical and mechanical contact to chip 101.

Attached to contact pad 104 is a stud, or bump, 105, preferably made of gold. Due to the fabrication method, bump 105 may have the shape of a deformed sphere. At the interface between gold and aluminum, is a layer 106 of gold/aluminum intermetallics (for copper bumps, layer 106 includes copper/aluminum intermetallics). The preferred method for fabricating bump 105 is a modified ball bonding technique. A wire bonder with a capillary is selected suitable for round gold wires in the diameter range between 15 and 33 µm, preferably 20 to 25 µm. For subsequent, bonding to aluminum pads and controlling the heat-affected zone in ball formation, the wire may include small contents of beryllium, copper, palladium, iron, silver, calcium or magnesium. From the length of the gold wire protruding from the capillary, a free air ball is formed using either a flame or a spark technique. The ball has a size with a preferred diameter from about 1.2 to 1.6 wire diameters, for example, between about 20 and 30 µm.

For bonding gold to aluminum, the semiconductor chip is positioned on a heated pedestal heated to a temperature between 150 and 300° C. The free air ball is placed on the pad 104 and pressed against the metallization of the pad. For pads of aluminum, a combination of compression force and ultrasonic energy creates the formation of gold-aluminum intermetallics and a strong metallurgical bond. The compression force is between about 17 and 75 g; the ultrasonic time between about 10 and 20 ms, the ultrasonic power between about 20 and 50 mW. At time of bonding, the temperature usually ranges from 150 to 270° C. The squeezed gold bump 105 looks like a deformed sphere.

The capillary is lifted and the wire is broken off from the squeezed sphere in the heat-affected mechanically weak zone. The wire stump remaining of the squeezed ball may be coined to flatten it. Dependent on the shape of the capillary orifice, bump 105 may have an additional truncated cone with a flat top as shown in FIGS. 1A and 1B, or a small additional wire length attached.

FIG. 1A further shows a portion of a dielectric substrate 110 for assembly of chip 101. Substrate 110 has contacts for external connection and may be laminated with conductive traces (not shown in FIG. 1A). The contact includes a copper body 111 (in other embodiments a contact area), a nickel layer 112, which covers the contact. body (or area) on all sides, and a solder layer 113. The nickel layer 112 is relatively thin (between about 0.04 and 2.0 µm, preferably 0.08 µm) and serves to prevent diffusion of copper from the contact body into the solder. The solder is tin or tin-based, substantially free of copper content, and relatively thick (2 to 10 µm). The deposition of the solder can be accomplished by various methods, including plating; it may further include one or more reflow steps.

FIG. 1B depicts an embodiment of the invention with an additional layer 114 over the nickel layer 112. Layer 114 is made of gold, alternatively of palladium, in order to promote the attachment of the solder 113; preferred thickness range is about 0.05 to 0.1 µm.

Figure 2:
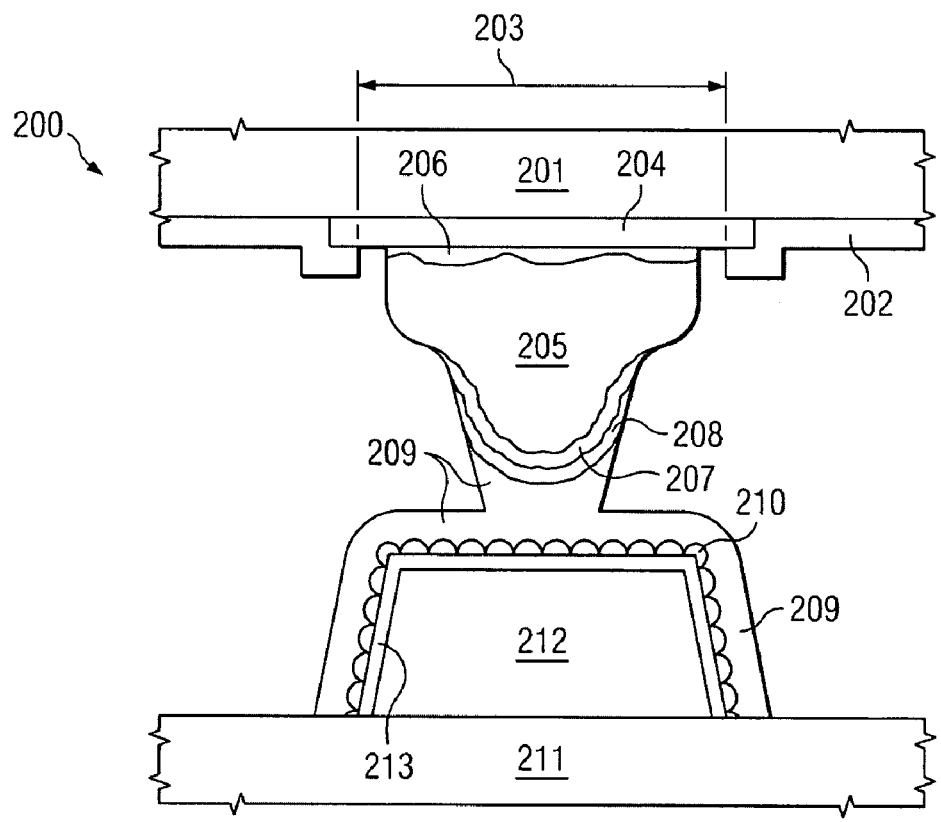
FIG. 2 is a schematic cross section of a metallic interconnect structure according to the invention, interconnecting a gold bump and a copper pad.

FIG. 2 illustrates an embodiment of the metallic interconnect structure, generally designated 200, between a gold bump and a copper pad after the interconnect structure has been formed. In FIG. 2, a portion of a semiconductor chip 201 has an insulating overcoat 202 (for example, silicon nitride or oxynitride) with a window 203 in the overcoat. The window defines pad 204, the exposed portion of the chip metallization, which is preferably aluminum or aluminum alloy with a surface bondable to gold. Alternatively, the chip metallization may be made of copper; again, the surface of pad 204 needs to be bondable to gold. For example, the surface of pad 204 may have a thin layer of gold or palladium. The exposed metal in window 203 serves as a pad for electrical and mechanical contact to chip 201.

Attached to contact pad 204 is a stud, or bump, 205, preferably made of gold. At the interface between gold and aluminum is a layer 206 of gold/aluminum intermetallics. The preferred method for fabricating bump 205 is as follows. A wire bonder with a capillary is selected suitable for round gold wires in the diameter range between 15 and 33 μm, preferably 20 to 25 μm. From the length of the gold wire protruding from the capillary, a free air ball is formed using either a flame or a spark technique. The ball has a size with a preferred diameter from about 1.2 to 1.6 wire diameters, for example, between about 20 and 30 μm.

For bonding gold to aluminum, the semiconductor chip is positioned on a heated pedestal heated to a temperature between 150 and 300° C. The free air ball is placed on the pad 204 and pressed against the metallization of the pad. For pads of aluminum, a combination of compression force and ultrasonic energy creates the formation of gold-aluminum intermetallics and a strong metallurgical bond.

Adjacent to gold bump 205 is a first region 207 of binary $AuSn_2$ intermetallic. Region 207 forms in the process of attaching the gold bump to the tin solder; it is stable in repeated reflow cycles and in equilibrium with the gold bump 205 and the tin solder. Adjacent to region 207 is region 208 of binary $AuSn_4$ intermetallic. This region also forms in the process of attaching the gold bump to the tin solder. It is stable in repeated reflow cycles, and its brittleness is compensated by the softness of the gold bump remaining after the reflow cycles. Consequently, the appearance of the brittle gold/tin intermetallics does not adversely affect the reliability of the chip-substrate interconnection in mechanical tests.

Adjacent to region 208 is region 209 of the bulk tin-solder with high gold content. Region 209 has the characteristics of a binary gold/tin solid solution. Next, as the final component of the interconnection between the gold bump and the nickel layer, layer 210 is a second region of binary $AuSn_2$ intermetallic; it is adjacent to both the solid solution region 209 and the nickel layer 213 overlaying the copper pad 212.

As stated above, all regions of gold/tin intermetallics (207, 208, 210) and solid solutions (209) are substantially free of copper and thus referred to as binary. They remain substantially stable after even multiple reflow cycles, wherein "multiple" refers to five or more. Consequently, gold bump 205 is substantially retained after multiple solder reflow cycles.

Copper pad 212 is a contact pad for external connections of dielectric substrate 211, onto which the chip 201 is assembled. Substrate 211 may have a plastic or ceramic base material, including a tape, and distributed or laminated conductive traces (not shown in FIG. 2). Copper pad 212 is covered by nickel layer 213, which has a preferred thickness of about 0.08 μm, sufficient to suppress and prevent copper diffusion from pad 212 into the tin solder.

Figure 3:
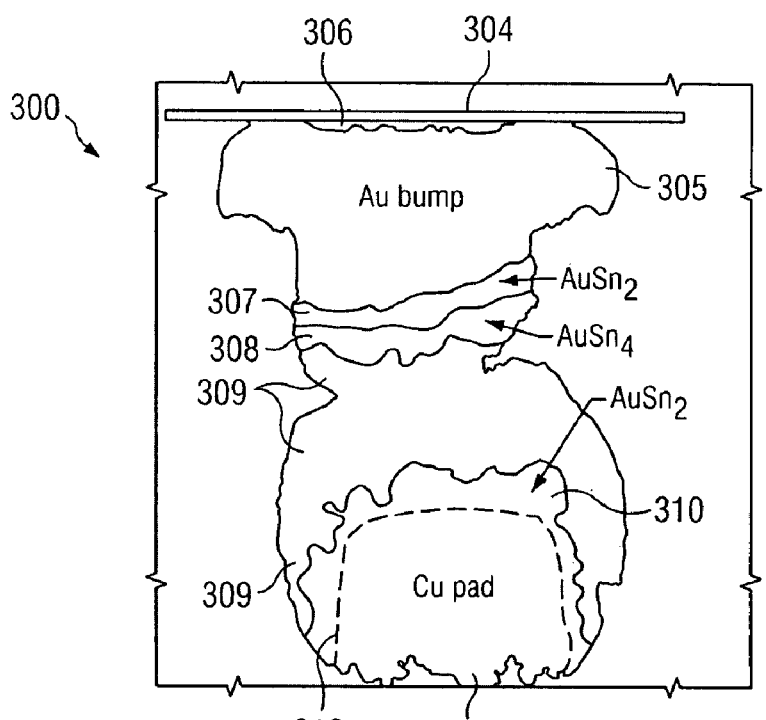
FIG. 3 illustrates a drawing of a microphotograph of a cross section of an interconnect structure between a gold bump and a copper pad, depicting intermetallic gold/tin regions of various compositions.

FIG. 3 shows a drawing made after a microphotograph (magnification 2000×) of a metallic interconnect structure, generally designated 300, for connecting a gold bump and a copper pad, illustrating the sequence of gold/tin intermetallic regions. The aluminum layer of the contact pad is designated 304, the gold bump bonded onto the aluminum is designated 305, and the gold/aluminum intermetallics region 306. The narrow first $AuSn_2$ intermetallic region 307 is adjacent to the gold bump 306 and to the relatively narrow $AuSn_4$ intermetallic region 308. The wide region 309 is the tin/gold solid solution, and region 310 is the second $AuSn_2$ intermetallic region, also relatively narrow and with castellated borders. The copper contact area, of the substrate is designated 312, and the very thin nickel layer (0.08 μm) is designated with the broken line 313.

An overview of FIG. 3 highlights the fact that the volumes of the soft gold bump and the soft tin/gold solid solution dominate significantly over the volumes of the brittle intermetallic layers. Consequently, the interconnection of FIG. 3 is capable of passing mechanical stress tests. Desirable interconnect structures such as shown in FIG. 3 will be maintained for 5 or more reflow cycles, because the diffusion of copper from pad 312 into the binary gold/tin compounds is prevented by nickel layer 313.

On the other hand, in devices without the nickel layer, an interconnect structure with the intermetallic regions can only be achieved by the first and fast (less than 1 s) reflow process. After repeated reflow cycles, copper will rapidly diffuse into the binary regions and transform the binary compounds into ternary compounds [such as $(Au,Cu)Sn_2$] of lower melting temperatures. Because of the high dissolution rate of gold into solder, more gold from bump 305 will then quickly be dissolved to diffuse towards substrate side, until bump 305 is completely consumed by the diffusion process, frequently already after the third reflow process. Further, the presence of copper in the molten solder decreases the saturation solubility of gold (see FIG. 5) so that the region-type intermetallics of FIG. 3 cannot form on the gold bump 305. Instead, $AuSn_4$ platelets form across the interconnection structure, intermixed with distributed AuSn regions.

Figure 4:
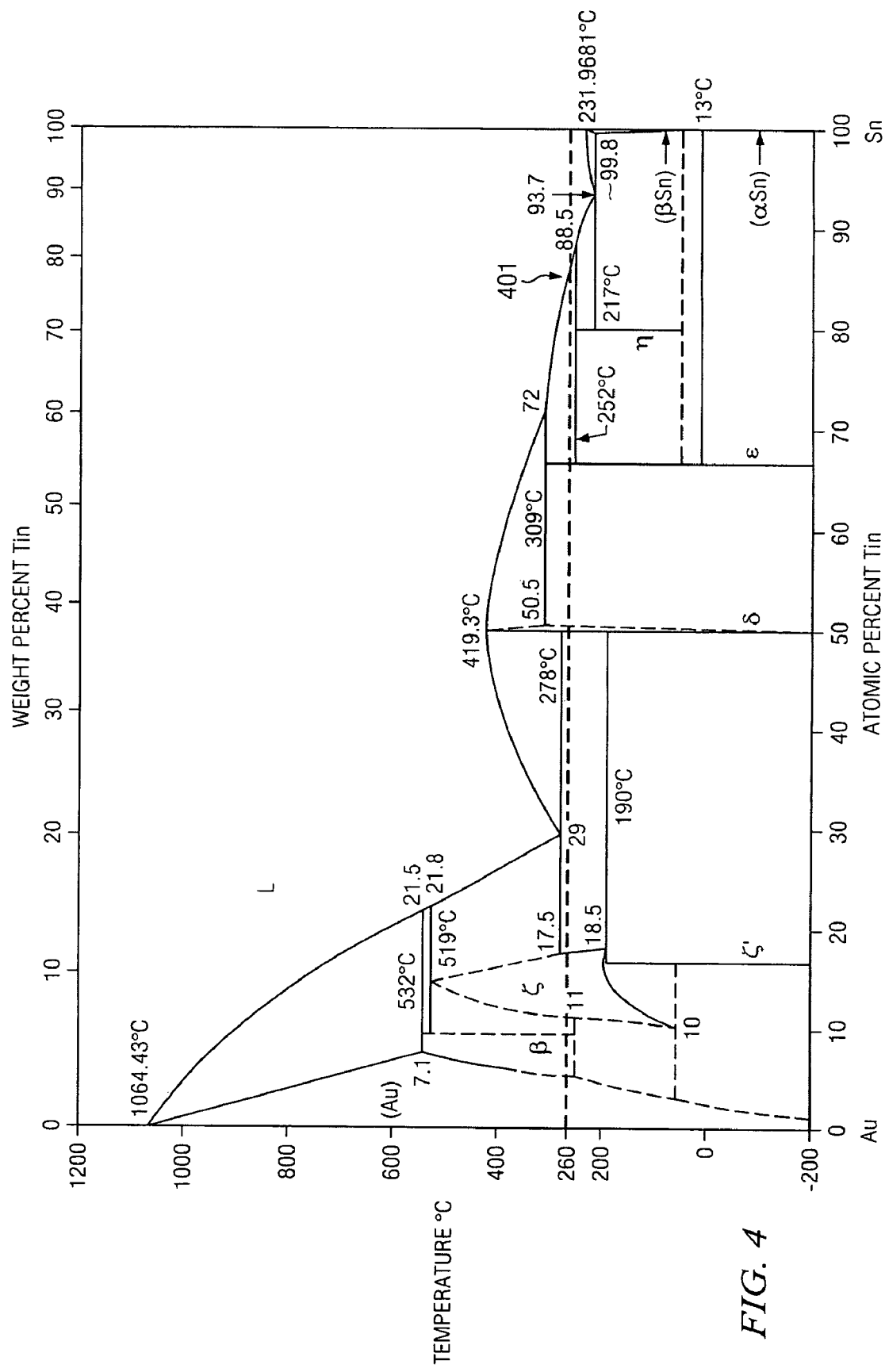
FIG. 4 is the binary gold/tin phase diagram. The linear abscissa shows atomic percent tin; the ordinate is the temperature axis (in ° C.).
Figure 5:
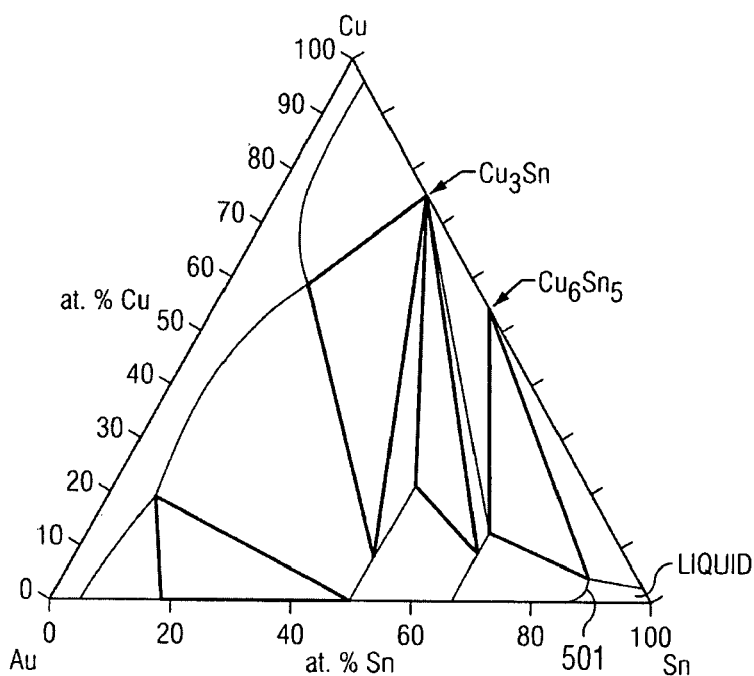
FIG. 5 shows the estimated gold/tin/copper ternary phase diagram at 260° C.

The decrease of the saturation solubility of gold by the presence of copper in the molten solder is depicted in FIG. 5 (which in turn is based on the gold vs. tin distribution at 260° C. as shown in the binary phase diagram in FIG. 4). FIG. 4 depicts the binary gold/tin phase diagram, with the linear abscissa showing atomic percent tin, the non-linear abscissa showing weight percent tin, and the ordinate the temperature in ° C. Selecting the temperature of 260° C. as the operating temperature for tin-melting techniques, the arrow 401 points to the solidus-liquidus regime under investigation, indicating 86 atomic percent tin. Using this composition, Applicants constructed the ternary phase diagram of FIG. 5 by the inclusion of copper in the gold/tin diagram. The ternary diagram reveals the existence of a liquid phase (marked "LIQUID" in FIG. 5), and the arrow 501 points to the solubility line gold/tin, where gold faces liquid tin in the presence of copper. It is this liquid phase, which dissolves ever more gold into dissolution, until the gold bump (designated 205 in FIG. 2) is completely consumed.

Figure 6:
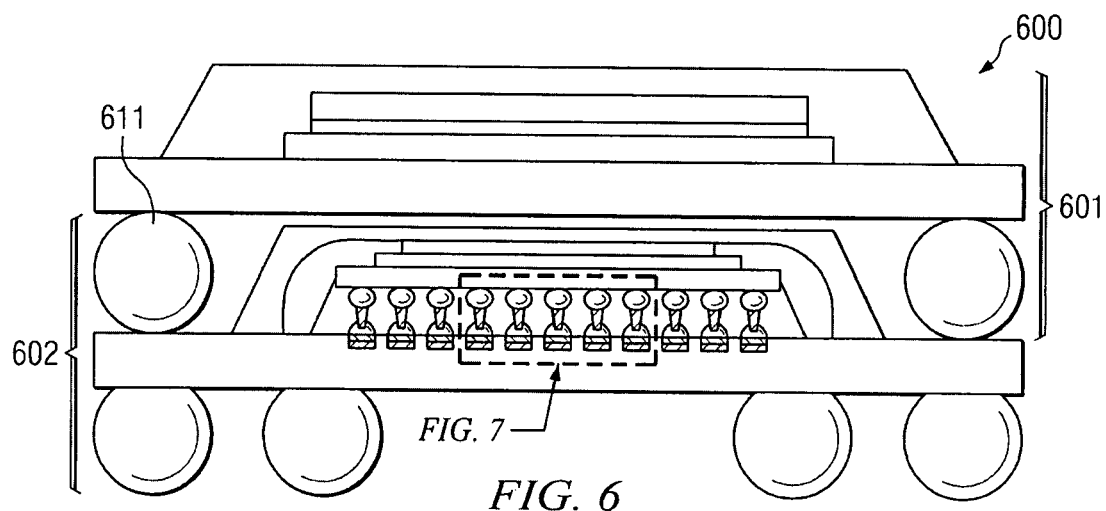
FIG. 6 is a schematic cross section of a package-on-package device with a flip-chip assembly according to the invention.
Figure 7:
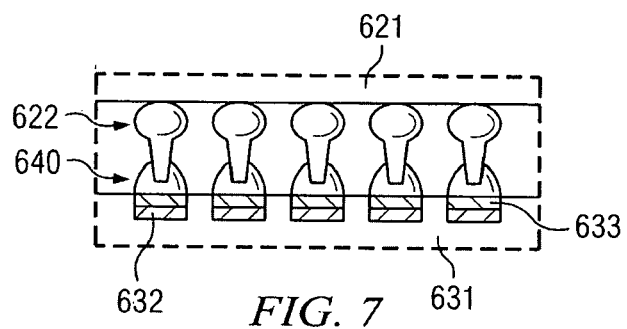
FIG. 7 is a schematic cross section of a portion of a package in FIG. 6, illustrating a magnified view of a metallic interconnect structure used by the invention.

FIG. 6 illustrates another embodiment of the invention, a package-on-package device generally designated 600, with a portion of the device magnified in FIG. 7. A first packaged semiconductor device 601 includes a stack of chips and is assembled with solder balls 611 on a second semiconductor device 602, which also contains a stack of chips. Some details of one of those chips 621 and the substrate 631 is shown in the magnification of FIG. 7. Each contact pad of chip 621 includes a gold bump 622. The dielectric substrate 631, on which chip 621 is assembled, has contacts for external connections, wherein each contact includes a copper contact area 632 and a nickel layer 633 covering the contact area 632.

The metallic structure 640 interconnecting the gold bump 622 and the nickel layer 633 has a structure as depicted in FIG. 2: A first region of binary $AuSn_2$ intermetallic adjacent to the gold bump 622; a region of binary $AuSn_4$ intermetallic adjacent to the first $AuSn_2$ region; a region of binary gold/tin solid solution in contact with the $AuSn_4$ region; and a second region of binary $AuSn_2$ intermetallic in contact with the solid solution region and with the nickel layer 633. The gap between chip 621 and substrate 631, determined by gold bump 622 and metallic structure 640, may be filled with a polymer precursor, which can polymerize (often referred to as underfill material).

Another embodiment of the invention is a method for fabricating a device with stabilized gold bump solder connections. The method starts by providing a semiconductor chip with contact pads, whereby each pad includes a gold bump. Next, a dielectric substrate is provided, which has contacts for external connections; each of these contacts includes a copper contact area, over which a layer of nickel of a thickness between about 0.04 and 2.0 µm is deposited to cover the copper. Optionally, a layer of gold may be deposited over the nickel layer. In case where no gold layer is deposited and while the nickel surface is still wet, a body of tin-based solder is deposited (by electrolytic or electroless plating) on the nickel layer. The tin-based solder is free of copper.

The chip is flipped towards the substrate so that the gold bumps face the solder bodies; then, respective gold bumps and solder bodies are aligned and the aligned gold bumps are brought into contact with the respective solder bodies. The temperature is raised to about 217 to 280° C. and kept at the peak temperature constant for a length of time less than 10 s to reflow the solder bodies and to form gold/tin intermetallics and solutions. Finally, the temperature is lowered to ambient temperature.

With copper blocked from entering the solution by the nickel layer, the structure of distinct binary tin/gold intermetallics and solutions will not change substantially, when further steps of repeating the solder reflow cycles are added by repeating the steps of raising and lowering the temperature.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the embodiments are effective in semiconductor devices and any other device with contact pads, which have to undergo assembly on a substrate or printed circuit board, sometimes followed by underfilling the gap between device and substrate. As another example, the semiconductor devices may include products based on silicon, silicon germanium, gallium arsenide and other semiconductor materials employed in manufacturing. As yet another example, the concept of the invention is effective for many semiconductor device technology nodes and not restricted to a particular one.

It is therefore intended that the appended claims encompass any such modifications or embodiments.

What is claimed is:

1. A metallic interconnect structure for connecting a gold bump and a copper pad, comprising:
   a gold bump;
   a first region of binary AuSn2 intermetallic adjacent to the gold bump;
   a region of binary AuSn4 intermetallic adjacent to the first AuSn2 region;
   a region of binary gold/tin solid solution adjacent to the AuSn4 region;
   a second region of binary AuSn2 intermetallic adjacent to the solid solution region; and
   a copper pad shielded by a nickel layer, the nickel layer adjacent to the second AuSn2 region.

2. The structure according to claim 1 wherein the nickel layer has a thickness of about 0.08 gm.

3. A device comprising:
   a semiconductor chip having contact pads, each pad including a gold bump;
   a dielectric substrate, on which the chip is assembled, having contacts for external connections, each contact including:
      a copper contact area;
      a nickel layer shielding the contact area; and
      a metallic structure interconnecting the gold bump and the nickel layer, the structure including:
         a first region of binary AuSn2 intermetallic adjacent to the gold bump;
         a region of binary AuSn4 intermetallic adjacent to the first AuSn2 region;
         a region of binary gold/tin solid solution adjacent to the AuSn4 region; and
         a second region of binary AuSn2 intermetallic adjacent to the solid solution region and to the nickel layer.

4. The device according to claim 3 wherein the nickel layer has a thickness of between about 0.04 gm and 2.0 gm.

* * * * *

UNITED STATES PATENT AND TRADEMARK OFFICE
CERTIFICATE OF CORRECTION

PATENT NO. : 7,939,939 B1
APPLICATION NO. : 11/867051
DATED : May 10, 2011
INVENTOR(S) : Kejun Zeng et al.

It is certified that error appears in the above-identified patent and that said Letters Patent is hereby corrected as shown below:

On the Title page of the patent in item (75), please make the change as follows:

Delete "~~Holford~~" and replace with Holdford.

Signed and Sealed this
Eighteenth Day of June, 2013

Teresa Stanek Rea
*Acting Director of the United States Patent and Trademark Office*